(12) United States Patent
Gatineau et al.

(10) Patent No.: US 9,109,281 B2
(45) Date of Patent: Aug. 18, 2015

(54) METAL HETEROCYCLIC COMPOUNDS FOR DEPOSITION OF THIN FILMS

(71) Applicant: L'Air Liquide, Société Anonyme pour l'Etude et l'Exploitation des Procédés Georges Claude, Paris (FR)

(72) Inventors: Julien Gatineau, Tsuchiura (JP); Kazutaka Yanagita, Tsukuba (JP); Shingo Okubo, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 14/147,168

(22) Filed: Jan. 3, 2014

(65) Prior Publication Data

US 2014/0119977 A1     May 1, 2014

Related U.S. Application Data

(62) Division of application No. 12/492,000, filed on Jun. 25, 2009, now Pat. No. 8,636,845.

(60) Provisional application No. 61/075,664, filed on Jun. 25, 2008.

(51) Int. Cl.
  *C30B 23/00* (2006.01)
  *C30B 25/00* (2006.01)
  (Continued)

(52) U.S. Cl.
  CPC ............. *C23C 16/18* (2013.01); *C01G 23/00* (2013.01); *C01G 25/02* (2013.01); *C23C 16/34* (2013.01); *C23C 16/405* (2013.01); *Y10T 117/10* (2015.01)

(58) Field of Classification Search
  USPC ............................................. 117/104, 88, 84
  See application file for complete search history.

(56) References Cited

U.S. PATENT DOCUMENTS

| 3,573,958 A | 4/1971 | Small |
| 4,141,778 A | 2/1979 | Domrachev et al. |

(Continued)

FOREIGN PATENT DOCUMENTS

| DE | 42 34 998 | 4/1994 |
| EP | 0 125 721 | 11/1984 |

(Continued)

OTHER PUBLICATIONS

Akkari, A. et al., "Three coordinate divalent Group 14 element compounds with a β-diketiminate as supporting ligand L²MX [L²=PhNC(Me)CHC(Me)NPh, X=Cl, I; M=Ge, Sn]", Journal of Organometallic Chemistry 622 (2001) pp. 190-198.

(Continued)

*Primary Examiner* — James McDonough
(74) *Attorney, Agent, or Firm* — Patricia E. McQueeney

(57) ABSTRACT

Methods and compositions for depositing a metal containing film on a substrate are disclosed. A reactor and at least one substrate disposed in the reactor are provided. A metal containing precursor is provided and introduced into the reactor, which is maintained at a temperature of at least 100° C. A metal is deposited on to the substrate through a deposition process to form a thin film on the substrate.

20 Claims, 1 Drawing Sheet

(51) Int. Cl.

| | |
|---|---|
| C30B 28/12 | (2006.01) |
| C30B 28/14 | (2006.01) |
| C23C 16/18 | (2006.01) |
| C01G 23/00 | (2006.01) |
| C01G 25/02 | (2006.01) |
| C23C 16/34 | (2006.01) |
| C23C 16/40 | (2006.01) |

(56) References Cited

U.S. PATENT DOCUMENTS

| | | | |
|---|---|---|---|
| 4,377,613 | A | 3/1983 | Gordon |
| 4,419,386 | A | 12/1983 | Gordon |
| 4,718,929 | A | 1/1988 | Power et al. |
| 5,051,278 | A | 9/1991 | Paz-Pujalt |
| 5,165,960 | A | 11/1992 | Platts |
| 5,271,956 | A | 12/1993 | Paz-Pujalt |
| 5,656,338 | A | 8/1997 | Gordon |
| 5,728,856 | A | 3/1998 | Denk |
| 6,005,127 | A | 12/1999 | Todd et al. |
| 6,273,951 | B1 * | 8/2001 | Vaartstra ............... 117/104 |
| 6,303,718 | B1 | 10/2001 | Becke et al. |
| 6,875,273 | B2 * | 4/2005 | Katamine et al. ........... 117/94 |
| 6,969,539 | B2 | 11/2005 | Gordon et al. |
| 6,984,591 | B1 | 1/2006 | Buchanan et al. |
| 7,182,812 | B2 * | 2/2007 | Sunkara et al. ........... 117/103 |
| 7,220,451 | B2 * | 5/2007 | Aaltonen et al. ......... 427/255.29 |
| 7,413,776 | B2 | 8/2008 | Shenai-Khatkhate et al. |
| 7,560,581 | B2 | 7/2009 | Gordon et al. |
| 7,754,908 | B2 | 7/2010 | Reuter et al. |
| 7,781,340 | B2 | 8/2010 | Chen et al. |
| 7,838,329 | B2 | 11/2010 | Hunks et al. |
| 7,943,502 | B2 | 5/2011 | Park et al. |
| 2005/0079290 | A1 | 4/2005 | Chen et al. |
| 2006/0035462 | A1 | 2/2006 | Millward |
| 2006/0046521 | A1 | 3/2006 | Vaartstra et al. |
| 2006/0063394 | A1 | 3/2006 | McSwiney et al. |
| 2006/0138393 | A1 | 6/2006 | Seo et al. |
| 2006/0172067 | A1 | 8/2006 | Ovshinsky et al. |
| 2006/0172068 | A1 | 8/2006 | Ovshinsky |
| 2006/0180811 | A1 | 8/2006 | Lee et al. |
| 2006/0292301 | A1 | 12/2006 | Herner |
| 2007/0042224 | A1 | 2/2007 | Reuter et al. |
| 2007/0054475 | A1 | 3/2007 | Lee et al. |
| 2007/0072415 | A1 | 3/2007 | Suzuki |
| 2008/0003359 | A1 | 1/2008 | Gordon et al. |
| 2008/0026577 | A1 | 1/2008 | Shenai-Khatkhate et al. |
| 2008/0035906 | A1 | 2/2008 | Park et al. |
| 2008/0096386 | A1 | 4/2008 | Park et al. |
| 2008/0108174 | A1 | 5/2008 | Park et al. |
| 2008/0108175 | A1 | 5/2008 | Shin et al. |
| 2008/0118636 | A1 * | 5/2008 | Shin et al. ............... 427/124 |
| 2008/0141937 | A1 | 6/2008 | Clark |
| 2008/0210973 | A1 | 9/2008 | Chen et al. |
| 2008/0226924 | A1 | 9/2008 | Okubo et al. |
| 2008/0261053 | A1 | 10/2008 | Arndt et al. |
| 2008/0279386 | A1 | 11/2008 | Kahn |
| 2009/0036697 | A1 | 2/2009 | Tada et al. |
| 2009/0072285 | A1 | 3/2009 | Hwang |
| 2009/0112009 | A1 | 4/2009 | Chen et al. |
| 2009/0137100 | A1 | 5/2009 | Xiao et al. |
| 2009/0142881 | A1 | 6/2009 | Xiao et al. |
| 2009/0162973 | A1 | 6/2009 | Gatineau et al. |
| 2009/0274930 | A1 | 11/2009 | Remington, Jr. |
| 2009/0280052 | A1 | 11/2009 | Xiao et al. |
| 2009/0299084 | A1 | 12/2009 | Okubo et al. |
| 2009/0305458 | A1 | 12/2009 | Hunks et al. |
| 2010/0009078 | A1 | 1/2010 | Pore et al. |
| 2010/0090781 | A1 | 4/2010 | Yamamoto et al. |
| 2010/0244087 | A1 * | 9/2010 | Horie et al. ............... 257/103 |
| 2011/0262660 | A1 | 10/2011 | Ishii et al. |
| 2013/0251903 | A1 | 9/2013 | Han |

FOREIGN PATENT DOCUMENTS

| | | |
|---|---|---|
| EP | 0 568 074 | 11/1993 |
| EP | 1 180 553 | 2/2002 |
| EP | 1 293 509 | 3/2003 |
| EP | 1 464 724 | 10/2004 |
| EP | 1 464 725 | 10/2004 |
| EP | 1 806 427 | 7/2007 |
| EP | 1 995 236 | 11/2008 |
| EP | 2 130 942 | 12/2009 |
| JP | H06 166691 | 6/1994 |
| JP | 2006 124743 | 5/2006 |
| JP | 2008 103731 | 5/2008 |
| JP | 2009 274949 | 11/2009 |
| WO | WO 83 01018 | 3/1983 |
| WO | WO 96 40448 | 12/1996 |
| WO | WO 98 16667 | 4/1998 |
| WO | WO 00 23635 | 4/2000 |
| WO | WO 00 29637 | 5/2000 |
| WO | WO 01 66816 | 9/2001 |
| WO | WO 02 27063 | 4/2002 |
| WO | WO 03 083167 | 10/2003 |
| WO | WO 2005 120154 | 12/2005 |
| WO | WO 2006 107121 | 10/2006 |
| WO | WO 2007 062096 | 5/2007 |
| WO | WO 2007 067604 | 6/2007 |
| WO | WO 2007 133837 | 11/2007 |
| WO | WO 2008 002546 | 1/2008 |
| WO | WO 2008 008319 | 1/2008 |
| WO | WO 2008 034468 | 3/2008 |
| WO | WO 2008 057616 | 5/2008 |
| WO | WO 2009 039187 | 3/2009 |
| WO | WO 2009 087609 | 6/2009 |
| WO | WO 2009 081383 | 7/2009 |
| WO | WO 2009 132207 | 10/2009 |
| WO | WO 2010 055423 | 5/2010 |
| WO | WO 2011 027321 | 3/2011 |
| WO | WO 2011 032272 | 3/2011 |
| WO | WO 2012 027357 | 3/2012 |
| WO | WO 2012 067439 | 5/2012 |

OTHER PUBLICATIONS

Asplund, M.C. et al., "Time-resolved infrared dynamics of C—F bond activation by a tungsten metal-carbonyl," The Journal of Physical Chemistry B., vol. 110, No. 1, Jan. 1, 2006, pp. 20-24.

Ayers, A.E. et al., "Azido derivatives of Germanium(II) and Tin(II): Syntheses and characterization of $[(Mes)^2DAP]GeN_3$, $[(Mes)_2DAP]SnN_3$, and the corresponding chloro analogues featuring heterocyclic six-π-electron ring systems (where $[(Mes)_2DAP]=N(Mes)C(Me)\}_2CH$)," Inorg. Chem. 2001, 40, pp. 1000-1005.

Becht, M. et al., "Nickel thin films grown by MOCVD using $Ni(dmg)_2$ as precursor," Journal de Physique IV, Colloque C5, Journal de Physique II supplement, vol. 5, Jun. 1995, pp. C5-465-C5-472.

Becker, G. et al., "Synthese, Struktur und Reaktivität des Lithium-[tris-trimethylsilyl]silyl]tellanids," Anorg. Allg. Chem., 1992, 613, pp. 7-18.

Bonasia, P.J. et al. "New reagents for the synthesis of compounds containing metal-tellurium bonds: sterically hindered silyltellurolate derivatives and the x-ray crystal structures of [(THF)2LiTeSi(SiMe3)3]2 and [(12-crown-4)2Li][TeSi(SiMe3)3]", J. Am. Chem. Soc., 1992, 114 (13), pp. 5209-5214.

Bonasia, P.J. et al., "Synthesis and characterization of gold(I) thiolates, selenolates, and tellurolates—x-ray crystal structures of $Au_4[TeC(SiMe_3)_3]_4$, $Au_4[SC(SiMe_3)_3]_4$, and $Ph_3PAu[TeC(SiMe_3)_3]$," Inorganic Chemistry, 1993, 32, pp. 5126-5131.

Breunig, H.J. "Thermochromic molecules with bonds of Se or Te and Sb or Bi", Phosphorus and Sulfur, 1988, vol. 38, pp. 97-102.

Brissonneau, L. et al., "MOCVD-processed Ni films from nickelocene. Part I: Growth rate and morphology," Chem. Vap. Deposition, 1999, vol. 5, No. 4, pp. 135-142.

Chizmeshya, A.V.G. et al., "Synthesis of butane-like SiGe hydrides: Enabling precursors for CVD of Ge-rich semiconductors," J. Am. Chem. Soc. 2006, 128, pp. 6919-6930.

(56) References Cited

OTHER PUBLICATIONS

Choi, J. et al., "Composition and electrical properties of metallic Ru thin films deposited using Ru($C_6H_6$)($C_6H_8$) precursor," Jpn. J. Appl. Phys., 2002, vol. 41, pp. 6852-6856.

Choi, B-J et al. "Cyclic PECVD of $Ge_2Sb_2Te_5$ films using metallorganic sources." J. Electrochem. Soc., 154 (4) H318-H324 (2007).

Choi, B-J et al. "Plasma-enhanced atomic layer deposition of $Ge_2Sb_2Te_5$ films using metal-organic sources for Phase change RAM." ALD 2006 proceedings, p. 62, 2006.

Dabbousi, B.O. et al., "($Me_3Si)_3SiTeH$: preparation, characterization, and synthetic utility of a remarkably stable tellurol," J. Am. Chem. Soc., 1991, 113, pp. 3186-3188.

Daff, P.J. et al., "Stable formally zerovalent and diamagnetic monovalent niobium and tantalum complexes based on diazadiene ligands," J. of Am. Chem. Soc., 2002, 124, pp. 3818-3819.

Detty, M.R. et al., "Bis(trialkylsilyl) chalcogenides. 1. Preparation and reduction of group 6A oxides," J. Org. Chem., 1982, 47, pp. 1354-1356.

Dieck, H. tom et al., "Diazadiene complexes of Group 4 metals. I. Synthesis of mono-, bis- and tris(diazadiene)titanium complexes and the structure of diazadienedichlorotitanium," Inorganica Chimica Acta, 177 (1990), pp. 191-197.

Dieck, H. tom et al., "Ruthenium complexes with diazadienes. 4. Arene diazadiene ruthenium(II) complexes [$\eta^6$-arene)(RN-CR'—CR'=NR)Ru(L)]$^{n+}$ (n-1, L-Cl, I, alkyl; n=2, L=MeCN, $\eta^2$-$C_2H_4$) and arene diazadiene ruthenium(0)," Organometallics 1986, 5, pp. 1449-1457.

Diercks, R. et al., "Diazadiene als Steuerlioganden in der homogenen Katalyse, IX. Katalytische Cyclotetramerisierung von Propiolsäureestern," Chem. Ber. vol. 118, No. 2 (1985), pp. 428-435.

Ding, Y. et al., "Synthesis and structures of monomeric divalent germanium and tin compounds containing a bulky diketiminato ligand," Organometallics 2001, 20, pp. 1190-1194.

Drake, J.E. et al. "Studies of silyl and germyl group 6 species. 5. Silyl and germyl derivatives of methane- and benzenetellurols," Inorg. Chem. 1980, 19, pp. 1879-1883.

Du Mont, W.W. et al., "Triorganophosphan-dichlor- und -dibroringermandiyl und -stannandiyl: Phosphan-stabilisierte Ge$^{II}$- und Sn$^{II}$-Halogenide," Angew. Chem. 88 Jahr. 1976, Nr. 9, p. 303.

Du Mont, W.W. et al., "α-Eliminierungsreaktionen an Trihalogengermylphosphinen," Journal of organometallic Chemistry, 128 (1977), p. 99-114.

Eom, T. et al., "Atomic Layer Deposition of (GeTe2)x(Sb2Te3)y films for phase change memories," Proceedings of Seoul National University Conference, Feb. 16-18, 2011.

Fischer, H. et al., "Ungewöhnloche 1,4-Insertion eines 1,4-Diazabutadiens in die C-H-Bindung von Benzyliden(pentacarbonyl)wolfram," Journal of Organometallic Chemistry, vol. 399, No. 1-2, Dec. 1, 1990, pp. 153-162.

Frühauf, H.-W., "Koordination von 1,4-Diaza-1,3-Dienen dad an Carbonyldieisen Fragmente," J. of Organometallic Chem., 301 (1986), pp. 183-193.

Glatz, F. et al. "Thermal CVD of amorphous germanium films from 2,5-bis(tert.-butyl)-2,5-diaza-1-germa-cyclopentane organometallic precursor." Mat. Res. Soc. Symp. Proc.,1994, vol. 336, pp. 541-545.

Gonzalez-Hernandez, et al. "Structure of oxygen-doped Ge:Sb:Te films." Thin Solid Films (2006), 503(1-2), 13-17.

Groenen, P.A.C. et al., "Mechanism of the reaction of $WF_6$ and Si," Applied Surface Science 78, 1994, pp. 123-132.

Groshens, T.J. et al., "Low temperature MOCVD growth of V/VI materials via a $Me_3SiNMe_2$ elimination reaction." Thermoelectrics, 1996. Fifteen International Conference on Pasadena, CA, USA Mar. 26-29, 1996, New York, Mar. 26, 1996, 430-434.

Gu et al. "Optical and structural properties of oxygen-doped and annealed Ge-Sb-Te- thin films." Chinese Journal of Lasers (2003), 30(12), 1110-1115.

Herrmann, W.A. et al. "Stable cyclic germanediyls ("cyclogermylenes"); Synthesis, structure, metal complexes, and thermolyses." Angew. Chem. Int. Ed. Engl., (1992) 31, No. 11, pp. 1485-1488.

Jansson, U., "Ultra-high vacuum CVD of W and $WSi_2$ films by Si reduction of $WF_6$," Applied Surface Science 73, 1993, pp. 51-57.

Jipa, I. et al., "'[cis-(1,3-Diene)$_2$W(CO)$_2$] complexes as MOCVD precursors for the deposition of thin tungsten—tungsten carbide films," Chemical Vapor Deposition 2010, 16, pp. 239-247.

Jutzi, P. et al., "Base stabilized germylene. II. Preparation and properties of benzothiazole dichlorogermylene," Journal of Organometallic Chemistry, 1974, vol. 81, No. 3, pp. 341-350.

Jutzi, P. et al., "On the reactivity of the silicon—carbon bond in pyridylsilanes," Journal of Organometallic Chemistry, 1976, vol. 104, No. 2, p. 153-160.

Jutzi, P. et al., "Stabilization of Monomeric Dichlorogermylene," Angew. Chem. Internat. Edit. vol. 12 (1973), No. 12, pp. 1002-1003.

Kada, T. et al., "Volatile CVD precursor for Ni Film: Cyclopentadienylallynickel," J. of Crystal Growth, 275 (2005), pp. e1115-e1119.

Kang, J.-K. et al., "Metalorganic chemical vapor deposition of nickel films from Ni($C_5H_5$)$_2$/$H_2$," J. Mater. Res., vol. 15, No. 8, Aug. 2000, pp. 1828-1833.

Kaplan, L.H. et al., "The deposition of molybdenum and tungsten films from vapor decomposition of carbonyls," J. Electrochem. Soc.: Solid State Science, May 1970, pp. 693-700.

Kim, Y-K et al. "Phase separation of a $Ge_2Sb_2Te_5$ alloy in the transition from an amorphous structure to crystalline structures." J. Vac. Sci. Technol. 929, 24(4), 2006.

Kim, R-Y et al. "Structural properties of $Ge_2Sb_2Te_5$ thin films by metal organic chemical vapor deposition for phase change memory applications." App. Phys. Lett., 89 (2006) 102107.

King, R.B. "Secondary and tertiary phosphine adducts of germanium(II) iodide", Inorganic Chemistry, vol. 2, No. 1, Feb. 1963.

Knisley, T.J. et al., Volatility and high thermal stability in mid- to late-first-row transition-metal diazadienyl complexes, Organometallics, 2011, 30, pp. 5010-5017.

Kouvetakis, J. et al., "Synthesis and atomic and electronic structure of new Si—Ge—C alloys and compounds," Chem. Matter. 1998, 10, pp. 2935-2949.

Kukli, K. et al., "Atomic layer deposition of hafnium dioxide films from 1-methoxy-2-methyl-2-propanolate complex of hafnium," Chem Mater. 2003, 15, pp. 1722-1727.

Lappert, M.F. et al. "Monomeric, coloured germanium(II) and tin(II) di-t-butylamides, and the crystal and molecular structure of Ge(NCMe$_2$[CH$_2$]$_3$CMe$_2$)$_2$". J. Chemical Soc. Chem. Comm. 1980, pp. 621-622.

Lee, J. et al. "GeSbTe deposition for the PRAM application". Appl. Surf. Sci., 253, pp. 3969-3976, 2007.

Lee, V.Y. et al., "Redox properties of dihalogermylenes, dihalostannylenes and their complexes with Lewis bases," Journal of Organometallic Chemistry, 499 (1995), pp. 27-34.

Li, Z. et al., "Direct-liquid-injection chemical vapor deposition of nickel nitride films and their reduction to nickel films," Chem. Mater., 2010, 22, pp. 3060-3066.

Lim, B.S. et al., "Synthesis and characterization of volatile, thermally stable, reactive transition metal amidinates," Inorg. Chem. 2003, 42, pp. 7951-7958.

Maruyama, T. et al., "Nickel thin films prepared by chemical vapor deposition from nickel acetylacetonate," J. of Materials Science, 28 (1993), pp. 5345-5348.

Min, K.-C. et al., "NiO thin films by MOCVD of Ni(dmamb)$_2$ and their resistance switching phenomena," Surface & Coatings Technology, 201 (2007), pp. 9252-9255.

Mironov, V.B. et al., "New method for preparing germanium dichloride and its use in syntheses of organogermanium compounds," Russian Journal of General Chemistry, vol. 64, No. 8, Part 1, 1994, p. 1180.

Mironov, V.B. et al., "New routes to germanium dihalide dioxanates," Russian Journal of General Chemistry, vol. 64, No. 4, Part 2, 1994, p. 633.

Nagendran, S. et al., "RGe(I)Ge(I)R compound (R=PhC(NtBu)$_2$ with a Ge—Ge single bond and a comparison with the gauche conformation of hydrazine," Organometallics 2008, 27, p. 5459-5463.

(56) References Cited

OTHER PUBLICATIONS

Naghavi, N. et al., "Growth studies and characterisation of In2S3 thin films deposited by atomic layer deposition (ALD)," Applied Surface Science 222 (2004), pp. 65-73.
Nefedov, O.M. et al., "Inorganic, organometallic, and organic analogues of carbenes," Angew. Chem. Internat. Edit., vol. 5 (1966), No. 12, pp. 1021-1038.
Nefedov O.M. et al., "Molecular complexes of germylene with n-donor ligands", Proceedings of the Academy of Sciences of the USSR Series Chemical, 1980, pp. 170-173, 1980.
Nefedov O.M. et al., "New adducted complexes of dichlorogermanium", Proceedings of the Academy of Sciences of the USSR Series Chemical, 1973, No. 12, pp. 2824-2825.
N-Methyl Morpholine product specification, downloaded from http://chemicalland21.com/industrialchem/functional%20Monomer/N-METHYL%20MORPHOLINE.htm Sep. 1, 2010.
Ogura, A. et al., "W chemical-vapor deposition using $(i-C_3H_7C_5H_4)_2WH_2$," J. Vac. Sci. Technol. A 26(4), Jul./Aug. 2008, pp. 561-564.
Pacl, Z. et al., "Organogermainum compounds. X. The effect of structure on the basicity of ethyl(dimethylamino)germanes," Collection Czechoslov, Chem. Commun. vol. 36, 1971, pp. 2181-2188.
Prokop, J. et al. "Selective deposition of amorphous germanium on Si with respect to $SiO_2$ by organometallic CVD." J. NonCryst. Solids, 198-200 (1996) pp. 1026-1028.
Putkonen, M. et al., "Atomic layer deposition of lithium containing thin films," Journal of Materials Chemistry, 2009, 19, pp. 8767-8771.
Razuvaev et al., "Complex compound of dichloride germanium," Proceedings of the Academy of Sciences of the USSR Series Chemical, 1966, No. 3, pp. 584-585.
Razuvaev, G.A. et al. "Organosilicon and organogermanium derivatives with silicon-metal and germanium-metal bonds," http://media.iupac.org/publications/pac/1969/pdf/1903x0353.pdf.
Ritala, M. et al., "Atomic layer deposition of $Ge_2Sb_2Te_5$ thin films," Microelectronic Engineering, 2009.10, vol. 86, No. 7-9, pp. 1946-1949.
Riviere, P. et al., "Germanium(II) and germanium(IV) compounds form elemental germanium," Organometallics 1991, 10, pp. 1227-1228.
Shcherbinin, V.V. et al. "Methods for preparing germanium dihalides," Russian J. of General Chem., vol. 68, No. 7, 1998, pp. 1013-1016.
Shibutami, T. et al., "A novel ruthenium precursor for MOCVD without seed ruthenium layer," Tosoh R&D Review, 2003, 47, pp. 61-63.
Spee, C.I.M.A. et al., "Deposition of titanium nitride thin films at low temperatures by CVD using metalorganic and organometallic titanium compounds as precursors," Journal de Physique IV, Colloque C3, Journal de Physique II supplement, vol. 3, Aug. 1993, pp. 289-296.
Spee, C.I.M.A. et al., "Tungsten deposition by organometallic chemical vapour deposition with organotungsten precursors," Materials Science and Engineering, B17, 1993, pp. 108-111.
Sun, Y.-M et al., "Low temperature chemical vapor deposition of tungsten carbide for copper diffusion barriers," Thin Sold Films 397, 2001, pp. 109-115.
Svoboda, M. et al., "Bis(diazadien)metal(O) complexes, III [1], Nickel(O)-bis(chelates) with aliphatic N-substituents," Naturforsch. 36b, 1981, pp. 814-822.
Wang, et al. "Influence of Sn doping upon the phase change characteristics of $Ge_2Sb_2Te_5$." Phys. Stat. Sol. (A) 3087-3095, 201(14), 2004.
Woelk, E. et al., "Designing novel organogermanium OMVPE precursors for high[purity germanium films," Journal of Crystal Growth 287 (2006), pp. 684-687.
Yamamoto, Y. et al., Selective growth of W at very low temperatures using a $WF_6$—$SiH_4$ gas system, Electrochemical Society Proceedings on CVD—XIII, 1996, vol. 96-5, pp. 814-820.
Yamamoto, Y. et al., "Surface reaction of alternately supplied $WF_6$ and $SiH_4$ gases," Surface Science 408, 1998, pp. 190-194.
Yang, T.S. et al., "Atomic layer deposition of nickel oxide films using $Ni(dmamp)_2$ and water," J. Vac. Sci. Technol. A 23(4), Jul./Aug. 2005, pp. 1238-1243.
Zinn, A. et al., "Reaction pathways in organometallic chemical vapor deposition (OMCVD)," Advanced materials 4, 1992, No. 5, pp. 375-378.
International Search Report and Written Opinion for related PCT/US2008/076698, Dec. 22, 2008.
International Search Report and Written Opinion for related PCT/IB2008/055499, May 15, 2009.
International Search Report and Written Opinion for related PCT/IB2009/008067, Jun. 1, 2010.
Singapore Written Opinion for related SG 201008444-0, Jul. 1, 2011.
International Search Report and Written Opinion for related PCT/IB2010/053961, Nov. 9, 2010.
International Search Report and Written Opinion for related PCT/IB2010/056118, Jun. 1, 2010.
International Search Report and Written Opinion for related PCT/IB2012/055169, Jan. 2, 2013.
International Search Report and Written Opinion for related PCT/IB2012/055171, Jan. 30, 2013.
International Search Report and Written Opinion for related PCT/IB2012/002554, Apr. 2, 2013.
Akiyama, Y. et al., "Epitaxial growth of lithium niobate film using metalorganic chemical vapor deposition," Thin Solid Films 515 (2007) 4975-4979.
Boo, J.H. et al., "Growth of magnesium oxide thin films using single molecular precursors by metal-organic chemical vapor deposition," Thin Solid Films 341 (1999), 63-67.
Bruder, H., "3. Diazadien-Metall(O)-Komplexe," Dissertation, Frankfurt Univ., Frankfurt, Germany 1977, 133-216, with English translation.
Burt, R.J. et al., "The preparation of mono($n^5$-cyclopentadienyl) complexes of niobium and tantalum," Journal of Organometallic Chemistry, (1977), (129), C33-C35.
Cho, S.-I. et al., "Improvement of discharge capacity of $LiCoO_2$ thin-film cathodes deposited in trench structure by liquid-delivery metalorganic chemical vapor deposition," Aplied Physics Letters, May 12, 2003, vol. 82, No. 19, 3345-3347.
Fowles, G.W.A. et al., "Some complexes of germanium(II) and tin(II) halides with nitrogen-donor ligands," Journal of the Less-Common Metals (15) (1968) 209-217.
Fragala, M.E. et al., "Synthesis, characterization, and mass transport properties of a self-generating single-source magnesium precursor for MOCVD of $MgF_2$ films," Chem. Mater 2009, vol. 21, No. 10, 2062-2069.
Fujihara, S. et al., "Preparation and characterization of $MgF_2$ thin film by a trifluoroacetic acid method," Thin Sold Films 1997, vol. 304, 252-255.
Herzog, A. et al., "Trimethyltin fluoride: a new fluorinating reagent for the preparation of organometallic fluorides," Organometallics (1994), 13(4), 1251-1256.
Kinzel, A., "Synthese einiger diazadien-elementverbundungen ihre reaktivitat and katalytische wirksamkeit," Dissertation, University of Hamburg, Hamburg, Germany 1979, 46-93.
Mutoh, Y. et al., "Telluration of selen- and chloroiminium salts leading to various telluroamides, and their structure and NMR properties," Journal of Organometallic Chemistry 692 (2007) 129-135.
Pilvi, T. et al., "Atomic layer deposition of $MgF_2$ thin films using $TaF_5$ as a novel fluorine source," Chem. Mater. 2008, 20, 5023-5038.
Pilvi, T. et al., "Atomic layer deposition process with $TiF_4$ as a precursor for depositing metal fluoride thin films," Applied Optics 2008, vol. 47, No. 13, C271-0274.
Pilvi, T. et al., "Study of a novel ALD process for depositing $MgF_2$ thin films," Journal of Mater. Chem.. 2007, 17, 5077-5083.
Schormann, M. et al., "Diphenyllead difluoride and trisphenylbismuth difluoride: new fluorinating reagents for the chlorine-fluorine metathesis reactions of Group 4 and 5 compounds" Journal of Fluorine Chemistry 101 (2000), 75-80.
Segi, M. et al., "Telluroaldehydes and telluroketones," J. Am. Chem. Soc. 1989, 111, 8749-8751.

(56) References Cited

OTHER PUBLICATIONS

Souquet, J.L. et al., "Thin film lithium batteries," Solid State Ionics 148 (2002), 375-379.

Stramare, S. et al., "Lithium lanthanum titanates: a review," Chem. Mater. 2003, 15, 3974-3990.

Toyoda, N. et al., "$MgF_2$ and $LaF_3$ thin film formation with gas cluster ion beam assisted deposition," Surface & Coatings Technology 2007, vol. 201, 8620-8623.

International Search Report and Written Opinion for related PCT/US2010/058340, Jun. 13, 2012.

* cited by examiner

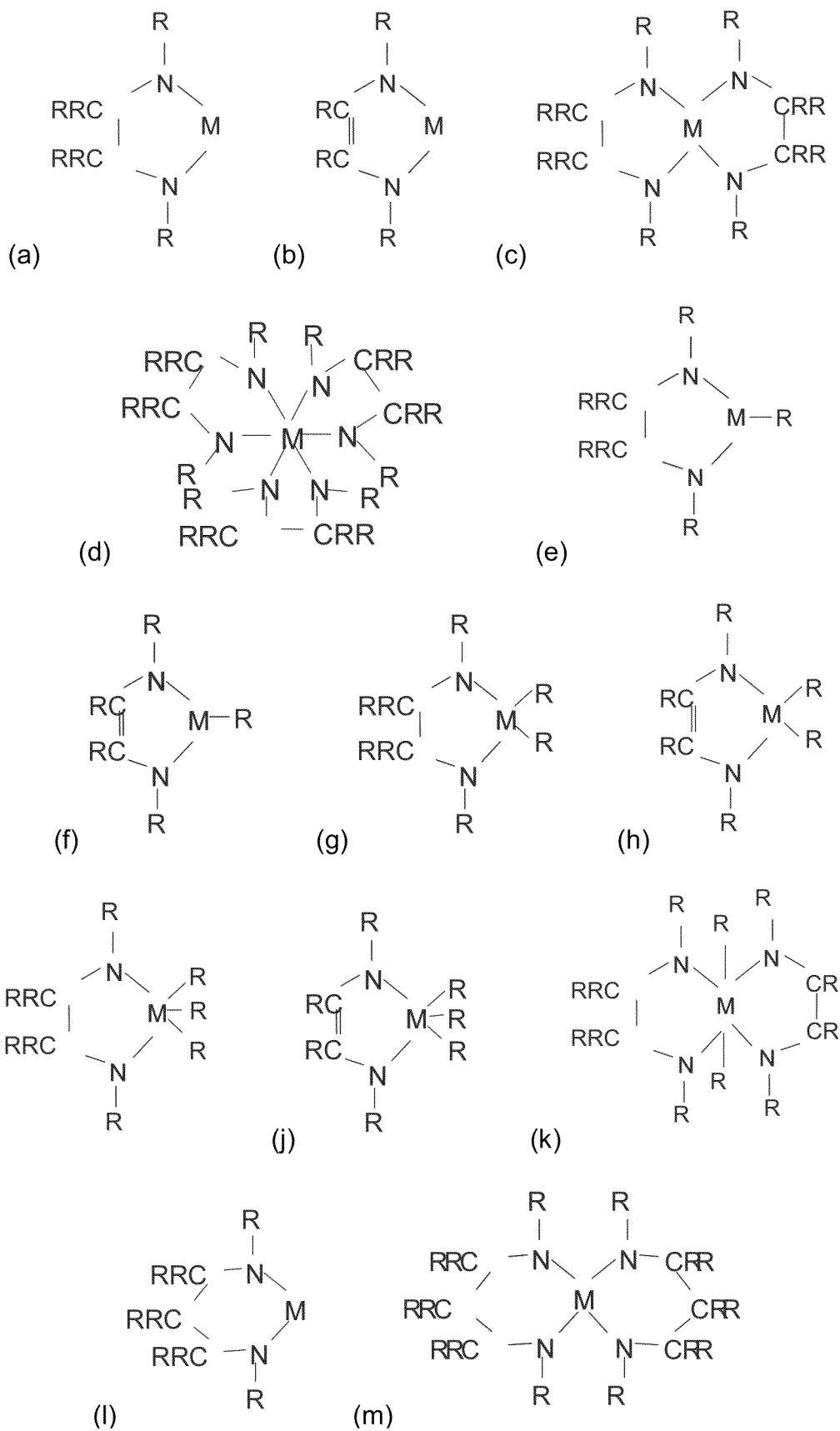

_METAL HETEROCYCLIC COMPOUNDS FOR DEPOSITION OF THIN FILMS_

CROSS-REFERENCE TO RELATED APPLICATIONS

This is a divisional application of U.S. patent application Ser. No. 12/492,000, filed Jun. 25, 2009 which claims the benefit of U.S. Provisional Application Ser. No. 61/075,664, filed Jun. 25, 2008, each being herein incorporated by reference in its entirety for all purposes.

BACKGROUND

1. Field of the Invention

This invention relates generally to compositions, methods and apparatus for use in the manufacture of semiconductor, photovoltaic, LCF-TFT, or flat panel type devices. More specifically, the invention relates to methods of forming a thing film on a substrate.

2. Background of the Invention

One reason the requirements for suitable metallorganic precursors, used in chemical vapor depositions (CVD) and/or atomic layer depositions (ALD) for semiconductor manufacturing processes, are increasing is due to the high surface coverage required by the deposited films, as compared to that found through physical vapor deposition methods (e.g. PVD, sputtering method).

For example, preferred production methods for GeSbTe alloy thin films, which are used in phase change memory devices, are changing from PVD methods to CVD/ALD methods with the increasing the capacity of memory cell. The demonstration sample of 512 Mega-bit PRAM was made by PVD method under 90 nm technology node processes in 2007, however in the future CVD/ALD methods will likely be necessary for the production of giga-bit scale (and greater) PRAM devices. A main issue for these future production methods is identifying suitable precursors which will allow for a low temperature, low impurity CVD/ALD film deposition. Similar situations are seen in many stages of semiconductor device manufacture. For instance, precursors for deposition of metallic titanium films are needed, due to the high level of impurities observed in the current processes.

Consequently, there exists a need for a need for materials and methods to deposit precursors to form thin films in semiconductor manufacturing processes.

BRIEF SUMMARY

The invention provides novel methods and compositions for the deposition of metal containing films on a substrate. In an embodiment, a method for depositing a metal film on a substrate comprises providing a reactor, and at least one substrate disposed in the reactor. A metal precursor is provided, where the metal precursor is metal-heterocyclic precursor with one of the following general formulas:

$$M(NR(CRR)_nNR)_x(R)_y \quad (I)$$

$$M(NRCR{=}CRNR)_x(R)_y \quad (II)$$

$$M'U_aZ_b \quad (III)$$

wherein each R is independently selected from among: H; linear, branched or cyclic C1-C6 alkyls; linear, branched or cyclic C1-C6 alkoxyls; linear, branched or cyclic C1-C6 alkylsilyls; linear, branched or cyclic C1-C6 perfluorocarbons; dialkylaminos of the general formula NR'R" (wherein R' and R" are independently selected from H, C1-C6 alkyls, C1-C6 alkylsilyls, C1-C6 perfluorocarbons, and C1-C6 alkylaminos); C1-C6 alkylimidos or alkylsilyliminos; cyanos; carbonyls; phenyls; benzyls; pyridyls; halogens (such as F, Cl, Br, and I); sulfos; nitros; carboxys; hydroxyls; diazos; and azidos;

in the case where R is not substituting part of the cyclometal group, R can be further independently selected from among: an amidinate of the general formula $R^1NC(CH3)NR^1$; a formamidinate of the general formula $R^1NCHNR^1$; a β-diketonate of the general formula $OCR^1CR^1CR^1O$; a β-enaminoketonate of the general formula $NR^1CR^1CR^1CR^1O$; and a β-diketiminate of the general formula $NR^1CR^1CR^1CR^1NR^1$; wherein each $R^1$ is independently selected from among: H; C1-C6 alkyls; C1-C6 alkylsilyls; C1-C6 perfluorocarbons; C1-C6 alkylaminos; dienyls (such as cyclopentadienyl, pentadienyl, cyclohexadienyl, hexadienyl), each dienyl ligand being substituted or not by C1-C6 linear or branched alkyl groups or C1-C6 linear or branched alkoxy groups; dienes (such as cyclohexadiene, hexadiene, norbornadiene, butadiene, cyclopentadiene, pentadiene, cyclooctadiene), each diene ligand being substituted or not by C1-C6 linear or branched alkyl groups or C1-C6 linear or branched alkoxy groups;

M is at least one member selected from the group consisting of: Be; B; Mg; Al; Si; P; S; Ca; Sc; Ti; V; Cr; Mn; Fe; Co; Ni; Cu; Zn; Ga; Ge; As; Se; Sr; Y; Zr; Nb; Mo; Ru; Rh; Pd; Ag; Cd; In; Sn; Sb; Te; Ba; La; Ce; Pr; Nd; Sm; Eu; Gd; Tb; Dy; Ho; Er; Tm; Yb; Lu; Hf; Ta; W; Re; Os; Ir; Pt; Au; Hg; Tl; Pb; and Bi; M' is at least one member selected from the group consisting of: Be; B; C; Mg; Al; Si; P; S; Ca; Sc; Ti; V; Cr; Mn; Fe; Co; Ni; Cu; Zn; Ga; Ge; As; Se; Sr; Y; Zr; Nb; Mo; Ru; Rh; Pd; Ag; Cd; In; Sn; Sb; Te; Ba; La; Ce; Pr; Nd; Sm; Eu; Gd; Tb; Dy; Ho; Er; Tm; Yb; Lu; Hf; Ta; W; Re; Os; Ir; Pt; Au; Hg; Tl; Pb; and Bi;

each U is independently selected from among: H; C1-C6 alkyls; C1-C6 alkylsilyls; C1-C6 perfluorocarbons; dialkylaminos of the general formula NR'R" (wherein R' and R" are independently selected from H, C1-C6 alkyls, C1-C6 alkylsilyls, C1-C6 perfluorocarbons, and C1-C6 alkylaminos); cyanos; carbonyls; phenyls; benzyls; pyridyls; halogens (such as F, Cl, Br, and I); sulfos; nitros; carboxys; hydroxyls; diazos; azidos; amidinates of the general formula $R^1NC(CH3)NR^1$; formamidinates of the general formula $R^1NCHNR^1$; β-diketonates of the general formula $OCR^1CR^1CR^1O$; β-enaminoketonates of the general formula $NR^1CR^1CR^1CR^1O$; and β-diketiminates of the general formula $NR^1CR^1CR^1CR^1NR^1$; wherein each $R^1$ is independently selected from among: H; C1-C6 alkyls; C1-C6 alkylsilyls; C1-C6 perfluorocarbons; C1-C6 alkylaminos; dienyls (such as cyclopentadienyl, pentadienyl, cyclohexadienyl, hexadienyl), each dienyl ligand being substituted or not by C1-C6 linear or branched alkyl groups or C1-C6 linear or branched alkoxy groups;

each Z is independently selected from the metal-heterocyclic precursors of general formula (I) or (II), wherein the oxidation state of the metal-heterocyclic precursor of general formula (I) or (II) has an oxidation state which allows for a coordination between M and M'; n is an integer such that $1 \leq n \leq 5$; x and y are integers independently determined based upon the oxidation state of M, such that x+y=oxidation state of M; and a and by are integers independently determined based upon the oxidation state of M', such that a+b=oxidation state of M.

Other embodiments of the current invention may include, without limitation, one or more of the following features:
the metal precursor contains an imido bond, the total number of R groups in the metal precursor is greater than or equal to two, and two R groups are substituted by one imido ligand;
the metal precursor is of general formula (III) and in the Z portion of the molecule, at least one R group which is indexed by the y variable is substituted with a direct M to M' bond;
maintaining the reactor at a temperature between about 100° C. and about 500° C., and preferably between about 200° C. and about 350° C.;
maintaining the reactor at a pressure between about 1 Pa and about $10^5$ Pa, and preferably between about 25 Pa and about $10^3$ Pa;
introducing at least one reducing gas into the reactor, wherein the reducing gas is at least one of: hydrogen; ammonia; silane; disilane; trisilane; hydrogen radicals; and mixtures thereof;
introducing at least one oxidizing gas into the reactor, wherein the oxidizing gas is at least one of: oxygen; ozone; water; hydrogen peroxide; nitric oxide; nitrous oxide; oxygen radicals; and mixtures thereof;
the metal precursor and the reducing gas and/or the oxidizing gas are introduced into the chamber either substantially simultaneously or sequentially;
the metal precursor and the reducing gas and/or the oxidizing gas are introduced into the chamber substantially simultaneously and the chamber is configured for chemical vapor deposition;
the metal precursor and the reducing gas and/or oxidizing gas are introduced into the chamber sequentially and the chamber is configured for atomic layer deposition;
the deposition process is a plasma enhanced deposition process (ALD or CVD); and
a metal containing thin film coated substrate.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

NOTATION AND NOMENCLATURE

Certain terms are used throughout the following description and claims to refer to various components and constituents. This document does not intend to distinguish between components that differ in name but not function.

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "t-Bu," refers to a tertiary butyl group; the abbreviation "iPr", refers to an isopropyl group; the abbreviation "acac", refers to acetylacetonato; and the abbreviation "Cp" refers to a cyclopentadienyl group.

As used herein the abbreviations: Be; B; C; N; Mg; Al; Si; P; S; Ca; Sc; Ti; V; Cr; Mn; Fe; Co; Ni; Cu; Zn; Ga; Ge; As; Se; Sr; Y; Zr; Nb; Mo; Ru; Rh; Pd; Ag; Cd; In; Sn; Sb; Te; Ba; La; Ce; Pr; Nd; Sm; Eu; Gd; Tb; Dy; Ho; Er; Tm; Yb; Lu; Hf; Ta; W; Re; Os; Ir; Pt; Au; Hg; Tl; Pb; and Bi generally refer to the corresponding elements from the periodic table of elements.

As used herein, the term "independently" when used in the context of describing R groups should be understood to denote that the subject R group is not only independently selected relative to other R groups bearing different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein:

FIG. 1 illustrates schematic representations of chemical structures corresponding to the metal precursor, as according to various embodiments of the current invention.

DESCRIPTION OF PREFERRED EMBODIMENTS

Generally, embodiments of the current invention relate to methods and compositions for the deposition of a metal containing film on a substrate through the use of a metal precursor. Generally, and as described above, the metal precursor is a metal-heterocyclic precursor with one of the following general formulas:

M(NR(CRR)$_n$NR)$_x$(R)$_y$     (I)

M(NRCR=CRNR)$_x$(R)$_y$,     (II)

M'U$_a$Z$_b$     (III)

In embodiments where the metal precursor has the general formula (I), the precursor may be shown structurally as in: FIG. 1(a) where an embodiment of the general formula (I) as M(RNCRRCRRNR)— is shown; FIG. 1(c) an embodiment of the general formula (I) as M(NRCRRCRRNR)(NRCRCRNR) is shown; FIG. 1(d) where an embodiment of the general formula (I) as M(NRCRRCRRNR)(NRCRRCRRNR)(NRCRRCRRNR) is shown; FIG. 1(e) where an embodiment the general formula (I) as M(NRCRRCRRNR)R is shown; FIG. 1(g) where an embodiment of the general formula (I) as M(NRCRRCRRNR)RR is shown; FIG. 1(i) where an embodiment of the general formula (I) as M(NRCRRCRRN-R)RRR is shown; FIG. 1(k) where an embodiment of the general formula (I) as (NRCRRCRRNR)M(NRCRRCR-RNR)—RR is shown; FIG. 1(l) where an embodiment of the general formula (I) as M(NRCRRCRRCRRNR) is shown; and FIG. 1(m) where an embodiment of the general formula (I) as (NRCRRCRRCRRNR)M(NRCRRCRRCRRNR) is shown. Examples of the precursors covered by general formula (I) include, but are not limited to: Ge(CH$_3$NCH$_2$CH$_2$NCH$_3$); Ge(C$_2$H$_5$NCH$_2$CH$_2$NC$_2$H$_5$); Ge(NCH(CH$_3$)$_2$CH$_2$CH$_2$NCH(CH$_3$)$_2$); Ge(NC(CH$_3$)$_3$CH$_2$CH$_2$NC(CH$_3$)$_3$); Ge(NCH(CH$_3$)$_2$C(CH$_3$)HC(CH$_3$)HNCH(CH$_3$)$_2$); Te(CH$_3$NCH$_2$CH$_2$NCH$_3$); Te(C$_2$H$_5$NCH$_2$CH$_2$NC$_2$H$_5$); Te(NCH(CH$_3$)$_2$CH$_2$CH$_2$NCH(CH$_3$)$_2$); Te(NC(CH$_3$)$_3$CH$_2$CH$_2$NC(CH$_3$)$_3$); Te(NCH(CH$_3$)$_2$C(CH$_3$)HC(CH$_3$)HNCH(CH$_3$)$_2$); Ti(CH$_3$NCH$_2$CH$_2$NCH$_3$); Ti(C$_2$H$_5$NCH$_2$CH$_2$NC$_2$H$_5$); Ti(NCH(CH$_3$)$_2$CH$_2$CH$_2$NCH(CH$_3$)$_2$); Ti(NC(CH$_3$)$_3$CH$_2$CH$_2$NC(CH$_3$)$_3$); Ti(NCH(CH$_3$)$_2$C(CH$_3$)HC(CH$_3$)HNCH(CH$_3$)$_2$); Si(CH$_3$NCH$_2$CH$_2$NCH$_3$); Si(C$_2$H$_5$NCH$_2$CH$_2$NC$_2$H$_5$); Si(NCH(CH$_3$)$_2$CH$_2$CH$_2$NCH(CH$_3$)$_2$); Si(NC(CH$_3$)$_3$CH$_2$CH$_2$NC(CH$_3$)$_3$); Si(NCH(CH$_3$)$_2$C(CH$_3$)HC(CH$_3$)HNCH(CH$_3$)$_2$); Sn(CH$_3$NCH$_2$CH$_2$NCH$_3$); Sn(C$_2$H$_5$NCH$_2$CH$_2$NC$_2$H$_5$); Sn(NCH(CH$_3$)$_2$CH$_2$CH$_2$NCH(CH$_3$)$_2$); Sn(NC(CH$_3$)$_3$CH$_2$CH$_2$NC(CH$_3$)$_3$); Sn(NCH(CH$_3$)$_2$C(CH$_3$)HC(CH$_3$)HNCH(CH$_3$)$_2$); (NC(CH$_3$)$_3$CH$_2$CH$_2$NC(CH$_3$)$_3$)Ti(NC(CH$_3$)$_3$CH$_2$CH$_2$NC(CH$_3$)$_3$); (NC(CH$_3$)$_3$CH$_2$CH$_2$NC(CH$_3$)$_3$)Si(NC(CH$_3$)$_3$CH$_2$CH$_2$NC(CH$_3$)$_3$); (NC(CH$_3$)$_3$CH$_2$CH$_2$NC(CH$_3$)$_3$)Te(NC(CH$_3$)$_3$CH$_2$CH$_2$NC(CH$_3$)$_3$); (NC(CH$_3$)$_3$CH$_2$CH$_2$NC(CH$_3$)$_3$)Ge(NC(CH$_3$)$_3$CH$_2$CH$_2$NC(CH$_3$)$_3$); (NC(CH$_3$)$_3$CH$_2$CH$_2$NC(CH$_3$)$_3$)Sn(NC(CH$_3$)$_3$CH$_2$CH$_2$NC(CH$_3$)$_3$); Fe(NC(CH$_3$)$_3$CH$_2$CH$_2$NC(CH$_3$)$_3$)$_3$; Ru(NC(CH$_3$)$_3$CH$_2$CH$_2$NC(CH$_3$)$_3$)$_3$; Sb(N(CH$_3$)CH$_2$CH$_2$N(CH$_3$))(NMe$_2$); Sb(N(CH$_3$)CH$_2$CH$_2$N(CH$_3$))(CH$_3$); Sb(N(CH$_3$)CH$_2$CH$_2$N(CH$_3$))(C$_2$H$_5$); Sb(NC(CH$_3$)$_3$CH$_2$CH$_2$NC(CH$_3$)$_3$)(NMe$_2$); Sb(NC(CH$_3$)$_3$CH$_2$CH$_2$NC(CH$_3$)$_3$)(CH$_3$); Sb(NC(CH$_3$)$_3$CH$_2$CH$_2$NC(CH$_3$)$_3$)(C$_2$H$_5$); Ti(NC(CH$_3$)$_3$CH$_2$CH$_2$NC(CH$_3$)$_3$)(N(CH$_3$)$_2$)$_2$; Si(NC(CH$_3$)$_3$CH$_2$CH$_2$NC(CH$_3$)$_3$)(N(CH$_3$)$_2$)$_2$; Ge(NC(CH$_3$)$_3$CH$_2$CH$_2$NC(CH$_3$)$_3$)(N(CH$_3$)$_2$)$_2$; Hf(NC(CH$_3$)$_3$CH$_2$CH$_2$NC(CH$_3$)$_3$)(N(CH$_3$)$_2$)$_2$; Zr(NC(CH$_3$)$_3$CH$_2$CH$_2$NC(CH$_3$)$_3$)(N(CH$_3$)$_2$)$_2$; Sn(NC(CH$_3$)$_3$CH$_2$CH$_2$NC(CH$_3$)$_3$)(N(CH$_3$)$_2$)$_2$; Ti(N(C(CH$_3$)$_3$)CH$_2$CH$_2$N(C(CH$_3$)$_3$)(CH$_3$)$_2$; Si(N(C(CH$_3$)$_3$)CH$_2$CH$_2$N(C(CH$_3$)$_3$)(CH$_3$)$_2$; Ge(N(C(CH$_3$)$_3$)CH$_2$CH$_2$N(C(CH$_3$)$_3$)(CH$_3$)$_2$; Hf(N(C(CH$_3$)$_3$)CH$_2$CH$_2$N(C(CH$_3$)$_3$)(CH$_3$)$_2$; Zr(N(C(CH$_3$)$_3$)CH$_2$CH$_2$N(C(CH$_3$)$_3$)(CH$_3$)$_2$; Ti(N(C(CH$_3$)$_3$)CH$_2$CH$_2$N(C(CH$_3$)$_3$)(C$_2$H$_5$)$_2$; Si(N(C(CH$_3$)$_3$)CH$_2$CH$_2$N(C(CH$_3$)$_3$)(C$_2$H$_5$)$_2$; Ge(N(C(CH$_3$)$_3$)CH$_2$CH$_2$N(C(CH$_3$)$_3$)(C$_2$H$_5$)$_2$; Hf(N(C(CH$_3$)$_3$)CH$_2$CH$_2$N(C(CH$_3$)$_3$)(C$_2$H$_5$)$_2$; Zr(N(C(CH$_3$)$_3$)CH$_2$CH$_2$N(C(CH$_3$)$_3$)(C$_2$H$_5$)$_2$; Ru(N(C(CH$_3$)$_3$)CH$_2$CH$_2$N(C(CH$_3$)$_3$)(iPrNC(CH$_3$)NiPr)$_2$; Fe(N(C(CH$_3$)$_3$)CH$_2$CH$_2$N(C(CH$_3$)$_3$)(iPrNC(CH$_3$)NiPr)$_2$; Os(N(C(CH$_3$)$_3$)CH$_2$CH$_2$N(C(CH$_3$)$_3$)(iPrNC(CH$_3$)NiPr)$_2$; Ta(NC(CH$_3$)$_3$CH$_2$CH$_2$NC(CH$_3$)$_3$)(NMe$_2$)$_3$; Nb(NC(CH$_3$)$_3$CH$_2$CH$_2$NC(CH$_3$)$_3$)(NMe$_2$)$_3$; Nb(NC(CH$_3$)$_3$CH$_2$CH$_2$NC(CH$_3$)$_3$)(CH$_3$)$_3$; Nb(NC(CH$_3$)$_3$CH$_2$CH$_2$NC(CH$_3$)$_3$)(C$_2$H$_5$)$_3$; Os(N(C(CH$_3$)$_3$)CH$_2$CH$_2$N(C(CH$_3$)$_3$)$_2$(C$_5$H$_5$); Fe(N(C(CH$_3$)$_3$)CH$_2$CH$_2$N(C(CH$_3$)$_3$)$_2$(C$_5$H$_5$); Ru(N(C(CH$_3$)$_3$)CH$_2$CH$_2$N(C(CH$_3$)$_3$)$_2$(C$_5$H$_5$); Ge(N(CH$_3$)CH$_2$CH$_2$CH$_2$N(CH$_3$)); Ge(NC(CH$_3$)$_3$CH$_2$CH$_2$CH$_2$N(CH$_3$)$_3$); Ti(N(CH$_3$)CH$_2$CH$_2$CH$_2$N(CH$_3$)); Ti(NC(CH$_3$)$_3$CH$_2$CH$_2$CH$_2$N(CH$_3$)$_3$); Si(N(CH$_3$)CH$_2$CH$_2$CH$_2$N(CH$_3$)); Si(NC(CH$_3$)$_3$CH$_2$CH$_2$CH$_2$N(CH$_3$)$_3$); Ge(N(CH$_3$)CH$_2$CH$_2$CH$_2$N(CH$_3$))$_2$; Ge(N(C$_2$H$_5$)CH$_2$CH$_2$CH$_2$N(C$_2$H$_5$))$_2$; Ti(N(CH$_3$)CH$_2$CH$_2$CH$_2$N(CH$_3$))$_2$; Ti(N(C$_2$H$_5$)CH$_2$CH$_2$CH$_2$N(C$_2$H$_5$))$_2$; Si(N(CH$_3$)CH$_2$CH$_2$CH$_2$N(CH$_3$))$_2$; and Si(N(C$_2$H$_5$)CH$_2$CH$_2$CH$_2$N(C$_2$H$_5$))$_2$.

In embodiments where the metal precursor has the general formula (II), the precursor may be shown structurally as in: FIG. 1(b) where an embodiment of the general formula (II) as M(RNCRCRNR) is shown; FIG. 1(f) where an embodiment of general formula (II) as M(NRCR=CRNR)R is shown; FIG. 1(h) where an embodiment of general formula (II) as M(NRCR=CRNR)RR is shown; and FIG. 1(j) where an embodiment of the general formula (II) as M(NRCR=CRNR)RRR is shown.

Examples of the precursors covered by general formula (II) include, but are not limited to: Ge(NCH$_3$CHCHNCH$_3$); Ge(C$_2$H$_5$NCHCHNC$_2$H$_5$); Ge(NCH(CH$_3$)$_2$CHCHNCH(CH$_3$)$_2$); Ge(NC(CH$_3$)$_3$CHCHNC(CH$_3$)$_3$); Ge(NC(CH$_3$)$_3$NC(CH$_3$)C(CH$_3$)NC(CH$_3$)$_3$); Te(CH$_3$NCHCHNCH$_3$); Te(C$_2$H$_5$NCHCHNC$_2$H$_5$); Te(NCH(CH$_3$)$_2$CHCHNCH(CH$_3$)$_2$); Te(NC(CH$_3$)$_3$CHCHNC(CH$_3$)$_3$); Te(NC(CH$_3$)$_3$C(CH$_3$)C(CH$_3$)NC(CH$_3$)$_3$); Ti(CH$_3$NCHCHNCH$_3$); Ti(C$_2$H$_5$NCHCHNC$_2$H$_5$); Ti(NCH(CH$_3$)$_2$CHCHNCH(CH$_3$)$_2$); Ti(NC(CH$_3$)$_3$NCHCHNC(CH$_3$)$_3$); Ti(NC(CH$_3$)$_3$NC(CH$_3$)C(CH$_3$)NC(CH$_3$)$_3$); Si(CH$_3$NCHCHNCH$_3$); Si(C$_2$H$_5$NCHCHNC$_2$H$_5$); Si(NCH(CH$_3$)$_2$CHCHNCH(CH$_3$)$_2$); Si(NC(CH$_3$)$_3$CHCHNC(CH$_3$)$_3$); Si(NC(CH$_3$)$_3$NC(CH$_3$)C(CH$_3$)NC(CH$_3$)$_3$); Sn(NCH$_3$NCHCHNCH$_3$); Sn(C$_2$H$_5$NCHCHNC$_2$H$_5$); Sn(NCH(CH$_3$)$_2$CHCHNCH(CH$_3$)$_2$); Sn(NC(CH$_3$)$_3$CHCHNC(CH$_3$)$_3$); Sn(NC(CH$_3$)$_3$C(CH$_3$)C(CH$_3$)NC(CH$_3$)$_3$); Sb(N(CH$_3$)CHCHN(CH$_3$))(N(CH$_3$)$_2$); Sb(N(CH$_3$)CHCHN(CH$_3$))(CH$_3$); Sb(N(CH$_3$)CHCHN(CH$_3$))(C$_2$H$_5$); Sb(NC(CH$_3$)$_3$CHCHNC(CH$_3$)$_3$)(N(CH$_3$)$_2$); Sb(NC(CH$_3$)$_3$CHCHNC(CH$_3$)$_3$)(CH$_3$); Sb(NC(CH$_3$)$_3$CHCHNC(CH$_3$)$_3$)(C$_2$H$_5$); Ru(NC(CH$_3$)$_3$CHCHNC(CH$_3$)$_3$)(C$_5$H$_5$); Ti(NC(CH$_3$)$_3$CHCHNC(CH$_3$)$_3$)(N(CH$_3$)$_2$)$_2$; Si(NC(CH$_3$)$_3$CHCHNC(CH$_3$)$_3$)(N(CH$_3$)$_2$)$_2$; Ge(NC(CH$_3$)$_3$CHCHNC(CH$_3$)$_3$)(N(CH$_3$)$_2$)$_2$; Sn(NC(CH$_3$)$_3$CHCHN(C(CH$_3$)$_3$)(N(CH$_3$)$_2$)$_2$; Ti(N(C(CH$_3$)$_3$)CHCHN(C(CH$_3$)$_3$)(CH$_3$)$_2$; Si(N(C(CH$_3$)$_3$)CHCHN(C(CH$_3$)$_3$)(CH$_3$)$_2$; Ge(N(C(CH$_3$)$_3$)CHCHN(C(CH$_3$)$_3$)(CH$_3$)$_2$; Ti(N(C(CH$_3$)$_3$)CHCHN(C(CH$_3$)$_3$)(C$_2$H$_5$)$_2$; Si(N(C(CH$_3$)$_3$)CHCHN(C(CH$_3$)$_3$)(C$_2$H$_5$)$_2$; Ge(N(C(CH$_3$)$_3$)CHCHN(C(CH$_3$)$_3$)(C$_2$H$_5$)$_2$); Si(N(C(CH$_3$)$_3$)CHCHN(C(CH$_3$)$_3$)(C$_2$H$_5$)$_2$; Ru(NC(CH$_3$)$_3$CHCHN(C(CH$_3$)$_3$)(iPrNC(CH$_3$)NiPr)$_2$; Fe(N(C(CH$_3$)$_3$)CHCHN(C(CH$_3$)$_3$)(iPrNC(CH$_3$)NiPr)$_2$; Os(N(C(CH$_3$)$_3$)CHCHN(C(CH$_3$)$_3$)(iPrNC(CH$_3$)NiPr)$_2$; Ta(NC(CH$_3$)$_3$CHCHNC(CH$_3$)$_3$)(NMe$_2$)$_3$; Ta(NC(CH$_3$)$_3$CHCHNC(CH$_3$)$_3$)(CH$_3$)$_3$; Ta(NC(CH$_3$)$_3$CHCHNC(CH$_3$)$_3$)(C$_2$H$_5$)$_3$; Nb(NC(CH$_3$)$_3$CHCHNC(CH$_3$)$_3$)(NMe$_2$)$_3$; Nb(NC(CH$_3$)$_3$CHCHNC(CH$_3$)$_3$)(CH$_3$)$_3$; and Nb(NC(CH$_3$)$_3$CHCHNC(CH$_3$)$_3$)(C$_2$H$_5$)$_3$.

In some embodiments, the precursor may be of general formula (III), where each Z is independently selected from the precursors of general formula (I) or (II), and where the oxidation state of the selected precursor is such as to allow a coordination between M and M'. This coordination can vary in form depending upon the individual precursors. In some embodiments the coordination may be a bi-metallic bond, but in other embodiments the coordination can be a much weaker association, such as in the case of pyridine which could be considered crystalline solvent type coordination.

Examples of the precursors covered by general formula (III) include, but are not limited to: Ni(Si(NC(CH$_3$)$_3$C(—CHCHCH—)CNC(CH$_3$)$_3$)$_4$; Ni(Si(NC(CH$_3$)$_3$CH$_2$CH$_2$NC(CH$_3$)$_3$))$_3$; Ni(Ge(NC(CH$_3$)$_3$CH$_2$CH$_2$NC(CH$_3$)$_3$))(CO)$_3$; Ni(Ge(NC(CH$_3$)$_3$CH$_2$CH$_2$NC(CH$_3$)$_3$))$_2$(CO)$_2$; Ni(Si(NC(CH$_3$)$_3$CH$_2$CH$_2$NC(CH$_3$)$_3$))$_2$(CO)$_2$; Ni(Ge(NC(CH$_3$)$_3$CH$_2$CH$_2$NC(CH$_3$)$_3$))$_3$; Co(Si(NC(CH$_3$)$_3$CH$_2$CH$_2$NC(CH$_3$)$_3$))$_3$; Co(Si(NC(CH$_3$)$_3$CH$_2$CH$_2$NC(CH$_3$)$_3$))$_2$(CO)$_2$; Si(Si(NC(CH$_3$)$_3$CH$_2$CH$_2$NC(CH$_3$)$_3$))$_4$; Ti(Si(NC(CH$_3$)$_3$CH$_2$CH$_2$NC(CH$_3$)$_3$))$_4$; Ge(Si(NC(CH$_3$)$_3$CH$_2$CH$_2$NC(CH$_3$)$_3$))$_4$; Sb(Si(NC(CH$_3$)$_3$CH$_2$CH$_2$NC(CH$_3$)$_3$))$_3$; Te(Si(NC(CH$_3$)$_3$CH$_2$CH$_2$NC(CH$_3$)$_3$))$_2$; Te(Sb(NC(CH$_3$)$_3$CH$_2$CH$_2$NC(CH$_3$)$_3$))$_2$; Te(Ge(NC(CH$_3$)$_3$CH$_2$CH$_2$NC(CH$_3$)$_3$))$_2$; Hf(Si(NC(CH$_3$)$_3$CH$_2$CH$_2$NC(CH$_3$)$_3$))$_4$; Zr(Si(NC(CH$_3$)$_3$CH$_2$CH$_2$NC(CH$_3$)$_3$))$_4$; Ti(Si(NC(CH$_3$)$_3$ CH₂CH₂NC(CH₃)₃))₂(N(CH₃)₂)₂; Ge(Si(NC(CH₃)₃CH₂CH₂NC(CH₃)₃))₂(N(CH₃)₂)₂; Te(Si(NC(CH₃)₃CH₂CH₂NC(CH₃)₃))(N(CH₃)₂); Te(Ge(NC(CH₃)₃CH₂CH₂NC(CH₃)₃))(N(CH₃)₂); Sb(Si(NC(CH₃)₃CH₂CH₂NC(CH₃)₃))(N(CH₃)₂)₂; Cr(Si(NC(CH₃)₃CH₂CH₂NC(CH₃)₃))₂(CO)₄; Mo(Si(NC(CH₃)₃CH₂CH₂NC(CH₃)₃))₂(CO)₄; W(Si(NC(CH₃)₃CH₂CH₂NC(CH₃)₃))₂(CO)₄; Cr(Si(NC(CH₃)₃CH₂CH₂NC(CH₃)₃))(Cp)₂; Mo(Si(NC(CH₃)₃CH₂CH₂NC(CH₃)₃))(Cp)₂; W(Si(NC(CH₃)₃CH₂CH₂NC(CH₃)₃))(Cp)₂; Ru(Si(NC(CH₃)₃CH₂CH₂NC(CH₃)₃))₂(CO)₃; Ru(C₅H₅)(CN)(CO)(Si(NC(CH₃)₃CH₂CH₂NC(CH₃)₃)); Ru(C₆H₆)(Si(NC(CH₃)₃CH₂CH₂NC(CH₃)₃MCH₃)₂CH)NC(CH₃)N(CH(CH₃)₂)); Os(C₅H₅)(CN)(CO)(Si(NC(CH₃)₃CH₂CH₂NC(CH₃)₃)); Os(C₆H₆)(Si(NC(CH₃)₃CH₂CH₂NC(CH₃)₃MCH₃)₂CH)NC(CH₃)N(CH(CH₃)₂); Fe(Si(NC(CH₃)₃CH₂CH₂NC(CH₃)₃))(CO)₄; Fe(C₅H₅)(CN)(CO)(Si(NC(CH₃)₃CH₂CH₂NC(CH₃)₃)); Fe(C₆H₆)(Si(NC(CH₃)₃CH₂CH₂NC(CH₃)₃))(((CH₃)₂CH)NC(CH₃)N(CH(CH₃)₂)); Ca(Si(NC(CH₃)₃CH₂CH₂NC(CH₃)₃))₂(NMe₂)₂; Sr(Si(NC(CH₃)₃CH₂CH₂NC(CH₃)₃))₂(NMe₂)₂; Ba(Si(NC(CH₃)₃CH₂CH₂NC(CH₃)₃))₂(NMe₂)₂; Ca(Si(NC(CH₃)₃CH₂CH₂NC(CH₃)₃))₂(N(SiMe₃)₂)₂; Sr(Si(NC(CH₃)₃CH₂CH₂NC(CH₃)₃))₂(N(SiMe₃)₂)₂; Ba(Si(NC(CH₃)₃CH₂CH₂NC(CH₃)₃))₂(N(SiMe₃)₂)₂; Sn(Si(NC(CH₃)₃CH₂CH₂NC(CH₃)₃))(NMe₂)₂; Sn(Si(NC(CH₃)₃CH₂CH₂NC(CH₃)₃))₂Cl₂; Sm(C(NC(CH₃)₃CH₂CH₂NC(CH₃)₃))(C₅H₅)₂; Sm(Si(NC(CH₃)₃CH₂CH₂NC(CH₃)₃))₂(C₅H₅)₂; Yb(C(NC(CH₃)₃CH₂CH₂NC(CH₃)₃))(C₅H₅)₂; Yb(Si(NC(CH₃)₃CH₂CH₂NC(CH₃)₃))(C₅H₅)₂; Eu(C(NC(CH₃)₃CH₂CH₂NC(CH₃)₃))(acac)₃; Eu(Si(NC(CH₃)₃CH₂CH₂NC(CH₃)₃))(acac)₃; Y(C(NC(CH₃)₃CH₂CH₂NC(CH₃)₃))(acac)₃; Y(Si(NC(CH₃)₃CH₂CH₂NC(CH₃)₃))(acac)₃; La(C(NC(CH₃)₃CH₂CH₂NC(CH₃)₃))(N(Si(CH₃)₃)₃; La(Si(NC(CH₃)₃CH₂CH₂NC(CH₃)₃))(N(Si(CH₃)₃)₃; Y(C(NC(CH₃)₃CH₂CH₂NC(CH₃)₃))(N(Si(CH₃)₃)₃; Y(Si(NC(CH₃)₃CH₂CH₂NC(CH₃)₃))(N(Si(CH₃)₃)₃; La(C(NC(CH₃)₃CH₂CH₂NC(CH₃)₃))₂(N(Si(H₂Me))₂)₃; La(Si(NC(CH₃)₃CH₂CH₂NC(CH₃)₃))₂(N(Si(H₂Me))₂)₃; Y(C(NC(CH₃)₃CH₂CH₂NC(CH₃)₃))₂(N(Si(H₂Me))₂)₃; Y(Si(NC(CH₃)₃CH₂CH₂NC(CH₃)₃))₂(N(Si(H₂Me))₂)₃; Rh(Si(NC(CH₃)₃CH₂CH₂NC(CH₃)₃))(C₈H₁₂)(((CH₃)₂CH)NC(CH₃)N(CH(CH₃)₂)); Ta(Si(NC(CH₃)₃CH₂CH₂NC(CH₃)₃))(NMe₂)₄; Mg(Si(NC(CH₃)₃CH₂CH₂NC(CH₃)₃))(Et)₂; Zn(Si(NC(CH₃)₃CH₂CH₂NC(CH₃)₃))(Et)₂; (Si(NC(CH₃)₃CH₂CH₂NC(CH₃)₃))AlMe₃; (Si(NC(CH₃)₃CH₂CH₂NC(CH₃)₃))GaMe₃; and (Si(NC(CH₃)₃CH₂CH₂NC(CH₃)₃))AlH₃.

Generally, the disclosed precursors may be deposited to form a thin film using any deposition methods known to those of skill in the art. In some embodiments the depositions are through a chemical vapor deposition (CVD) or atomic layer deposition (ALD) method. Examples of suitable deposition methods include without limitation, conventional CVD, low pressure chemical vapor deposition (LPCVD), plasma enhanced chemical vapor depositions (PECVD), atomic layer deposition (ALD), pulsed chemical vapor deposition (P-CVD), plasma enhanced atomic layer deposition (PE-ALD), or combinations thereof.

In an embodiment, the metal precursor is introduced into a reactor in vapor form. The precursor in vapor form may be produced by vaporizing a liquid precursor solution, through a conventional vaporization step such as direct vaporization, distillation, or by bubbling an inert gas (e.g. N₂, He, Ar, etc.) into the precursor solution and providing the inert gas plus precursor mixture as a precursor vapor solution to the reactor. Bubbling with an inert gas may also remove any dissolved impurities (e.g. oxygen) present in the precursor solution.

The reactor may be any enclosure or chamber within a device in which deposition methods take place such as without limitation, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates on to which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium, or gold) may be used. The substrate may also have one or more layers of differing materials already deposited upon it from a previous manufacturing step.

In some embodiments, in addition to the metal precursor, a reactant gas may also be introduced into the reactor. In some of these embodiments, the reactant gas may be an oxidizing gas such as one of oxygen, ozone, water, hydrogen peroxide, nitric oxide, nitrogen dioxide, radical species of these, as well as mixtures of any two or more of these. In some other of these embodiments, the reactant gas may be a reducing gas such as one of hydrogen, ammonia, a silane (e.g. SiH₄; Si₂H₆; Si₃H₈), SiH₂Me₂; SiH₂Et₂; N(SiH₃)₃; radical species of these, as well as mixtures of any two or more of these.

In some embodiments, and depending on what type of film is desired to be deposited, a second precursor may be introduced into the reactor. The second precursor comprises another metal source, such as copper, praseodymium, manganese, ruthenium, titanium, tantalum, bismuth, zirconium, hafnium, lead, niobium, magnesium, aluminum, lanthanum, or mixtures of these. In embodiments where a second metal containing precursor is utilized, the resultant film deposited on the substrate may contain at least two different metal types.

The metal precursor and any optional reactants or precursors may be introduced sequentially (as in ALD) or simultaneously (as in CVD) into the reaction chamber. In some embodiments, the reaction chamber is purged with an inert gas between the introduction of the precursor and the introduction of the reactant. In one embodiment, the reactant and the precursor may be mixed together to form a reactant/precursor mixture, and then introduced to the reactor in mixture form. In some embodiments, the reactant may be treated by a plasma, in order to decompose the reactant into its radical form. In some of these embodiments, the plasma may generally be at a location removed from the reaction chamber, for instance, in a remotely located plasma system. In other embodiments, the plasma may be generated or present within the reactor itself. One of skill in the art would generally recognize methods and apparatus suitable for such plasma treatment.

In some embodiments, the temperature and the pressure within the reactor are held at conditions suitable for ALD or CVD depositions. For instance, the pressure in the reactor may be held between about 1 Pa and about 10⁵ Pa, or preferably between about 25 Pa and 10³ Pa, as required per the deposition parameters. Likewise, the temperature in the reactor may be held between about 100° C. and about 500° C., preferably between about 200° C. and about 350° C.

Depending on the particular process parameters, deposition may take place for a varying length of time. Generally, deposition may be allowed to continue as long as desired or necessary to produce a film with the necessary properties. Typical film thicknesses may vary from several hundred angstroms to several hundreds of microns, depending on the specific deposition process. The deposition process may also be performed as many times as necessary to obtain the desired film.

In some embodiments, the precursor vapor solution and the reaction gas, may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

EXAMPLES

The following non-limiting examples are provided to further illustrate embodiments of the invention. However, the examples are not intended to be all inclusive and are not intended to limit the scope of the inventions described herein.

Prophetic Example 1

Titanium films may be deposited at temperatures above 200° C. Vapors of the precursor $Ti(N(tBu)CH_2CH_2N(tBu))(NMe_2)_2$ may be delivered to a reaction furnace using $N_2$ as a carrier gas, as well as for dilution purposes. Hydrogen may be used as a reactant.

In this way, titanium films are expected to be obtained in ALD mode at temperatures above 200 C.

It is expected that the concentrations of various undesired elements in the deposited metal films when analyzed by an Auger spectrometry method, will be below the detection limit of the apparatus.

Prophetic Example 2

Titanium nitride films are expected to be deposited, as described in Example 1, when ammonia is used instead of hydrogen.

Prophetic Example 3

Germanium films may be deposited at temperatures above 200° C. Vapors of the precursor $Ge(N(tBu)CHCHN(tBu))(NMe_2)_2$ may be delivered to a reaction furnace using $N_2$ as a carrier gas, as well as for dilution purposes. Hydrogen may be used as a reactant.

In this way, germanium films are expected to be obtained in ALD mode at temperatures above 200 C.

It is expected that the concentrations of various undesired elements in the deposited metal films when analyzed by an Auger spectrometry method, will be below the detection limit of the apparatus.

Prophetic Example 4

Germanium nitride films are expected to be deposited, as described in Example 3, when ammonia is used instead of hydrogen.

Prophetic Example 5

Zirconium oxide films may be deposited at temperatures above 220° C. Vapors of the precursor $Zr(N(tBu)CH_2CH_2N(tBu))(NMe_2)_2$ may be delivered to a reaction furnace using $N_2$ as a carrier gas, as well as for dilution purposes. Water may be used as a reactant.

In this way, zirconium oxide films are expected to be obtained in ALD mode at temperatures above 200 C.

It is expected that the concentrations of various undesired elements in the deposited metal films when analyzed by an Auger spectrometry method, will be below the detection limit of the apparatus.

Prophetic Example 6

Zirconium oxide films are expected to be deposited, as described in Example 5, when ozone is used instead of water.

Prophetic Example 7

Nickel films may be deposited at temperatures above 200° C. Vapors of the precursor $Ni(SiNC(CH_3)_3CH_2CH_2NC(CH_3)_3)_4$ may be delivered to a reaction furnace using $N_2$ as a carrier gas, as well as for dilution purposes. Hydrogen may be used as a reactant.

In this way, nickel films are expected to be obtained in ALD mode at temperatures above 200 C.

It is expected that the concentrations of various undesired elements in the deposited metal films when analyzed by an Auger spectrometry method, will be below the detection limit of the apparatus.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a metal containing film on a substrate, comprising:
   a) providing a reactor and at least one substrate disposed therein;
   b) introducing a metal precursor into the reactor, wherein the metal precursor is selected from the group consisting of: $Te(CH_3NCHCHNCH_3)$; $Te(C_2H_5NCHCHNC_2H_5)$; $Te(NCH(CH_3)CHCHNCH(CH_3)_2)$; $Te(NC(CH_3)_3 CHCHNC(CH_3)_3)$; $Te(NC(CH_3)_3C(CH_3)C(CH_3)NC(CH_3)_3)$; $Ti(CH_3NCHCHNCH_3)$; $Ti(C_2H_5NCHCHNC_2H)$; $Ti(NCH(CH_3)_2CHCHNCH(CH_3)_2)$; $Ti(NC(CH_3)_3NCHCHNC(CH_3)_3)$; $Ti(NC(CH_3)_3NC(CH_3)C(CH_3)NC(CH_3)_3)$; $Si(CH_3NCHCHNCH_3)$; $Si(C_2H_5NCHCHNC_2H_5)$; $Si(NCH(CH_3)_2CHCHNCH(CH_3)_2)$; $Si(NC(CH_3)_3 CHCHNC(CH_3)_3)$; $Si(NC(CH_3)_3NC(CH_3)C(CH_3)NC(CH_3)_3)$; $Sn(NCH_3NCHCHNCH_3)$; $Sn(C_2H_5NCHCHNC_2H_5)$; $Sn(NCH(CH_3)_2CHCHNCH(CH_3)_2)$; $Sn(NC(CH_3)_3CHCHNC(CH_3)_3)$; $Sn(NC(CH_3)_3C(CH_3)C(CH_3)NC(CH_3)_3)$; $Sb(N(CH_3)CHCHN(CH_3))(N(CH_3)_2)$; $Sb(N(CH_3)CHCHN(CH_3))(CH_3)$; $Sb(N(CH_3)CHCHN(CH_3)(C_2H_5)$; $Sb(NC(CH_3)_3CHCHNC(CH_3)_3)(N(CH_3)_2)$; $Sb(NC(CH_3)_3 CHCHNC(CH_3)_3)(CH_3)$; $Sb(NC(CH_3)_3CHCHNC(CH_3)_3)(C_2H_5)$; $Ru(NC(CH_3)_3CHCHNC(CH_3)_3)(C_5H_5)$; $Ti(NC(CH_3)_3CHCHNC(CH_3)_3)(N(CH_3)_2)_2$; $Si(NC(CH_3)_3CHCHNC(CH_3)_3)(N(CH_3)_2)_2$; $Sn(NC(CH_3)_3CHCHN(C(CH_3)_3)(N(CH_3)_2)_2$; $Ti(N(C(CH_3)_3$ CHCHN(C(CH$_3$)$_3$)(CH$_3$)$_2$; Si(N(C(CH$_3$)$_3$)CHCHN(C(CH$_3$)$_3$)(CH$_3$)$_2$; Ti(N(C(CH$_3$)$_3$)CHCHN(C(CH$_3$)$_3$)(C$_2$H$_5$)$_2$; Si(N(C(CH$_3$)$_3$)CHCHN(C(CH$_3$)$_3$)(C$_2$H$_5$)$_2$; Si(N(C(CH$_3$)$_3$)CHCHN(C(CH$_3$)$_3$)(C$_2$H$_5$)$_2$; Ru(NC(CH$_3$)$_3$CHCHN(C(CH$_3$)$_3$)(iPrNC(CH$_3$)NiPr)$_2$; Fe(N(C(CH$_3$)$_3$)CHCHN(C(CH$_3$)$_3$)(iPrNC(CH$_3$)NiPr)$_2$; Os(N(C(CH$_3$)$_3$)CHCHN(C(CH$_3$)$_3$)(iPrNC(CH$_3$)NiPr)$_2$; Ta(NC(CH$_3$)$_3$CHCHNC(CH$_3$)$_3$)(NMe$_2$)$_3$; Ta(NC(CH$_3$)$_3$CHCHNC(CH$_3$)$_3$)(CH$_3$)$_3$; Ta(NC(CH$_3$)$_3$CHCHNC(CH$_3$)$_3$)(C$_2$H$_5$)$_3$; Nb(NC(CH$_3$)$_3$CHCHCNC(CH$_3$)$_3$)(NMe$_2$)$_3$; Nb(NC(CH$_3$)$_3$CHCHNC(CH$_3$)$_3$)(CH$_3$)$_3$; and Nb(NC(CH$_3$)$_3$CHCHNC(CH$_3$)$_3$)(C$_2$H$_5$)$_3$;
  c) maintaining the reactor at a temperature of at least about 100° C.; and
  d) decomposing the metal precursor onto the substrate to form a metal containing film.

2. The method of claim 1, wherein the metal precursor comprises an imido bond; the total number of R groups is greater than or equal to 2; and two R groups are substituted by one imido ligand.

3. The method of claim 1, wherein the precursor comprises at least one member selected from the group consisting of: Te(NCH(CH$_3$)$_2$CHCHNCH(CH$_3$)$_2$); Te(NC(CH$_3$)$_3$CHCHNC(CH$_3$)$_3$); Te(NC(CH$_3$)$_3$C(CH$_3$)C(CH$_3$)NC(CH$_3$)$_3$); Ti(NCH(CH$_3$)$_2$CHCHNCH(CH$_3$)$_2$); Ti(NC(CH$_3$)$_3$NCHCHNC(CH$_3$)$_3$); Ti(NC(CH$_3$)$_3$NC(CH$_3$)C(CH$_3$)NC(CH$_3$)$_3$); Si(NCH(CH$_3$)$_2$CHCHNCH(CH$_3$)$_2$); Si(NC(CH$_3$)$_3$CHCHNC(CH$_3$)$_3$); Si(NC(CH$_3$)$_3$NC(CH$_3$)C(CH$_3$)NC(CH$_3$)$_3$); Sn(NCH(CH$_3$)$_2$CHCHNCH(CH$_3$)$_2$); Sn(NC(CH$_3$)$_3$CHCHNC(CH$_3$)$_3$); Sn(NC(CH$_3$)$_3$C(CH$_3$)C(CH$_3$)NC(CH$_3$)$_3$); Sb(NC(CH$_3$)$_3$CHCHNC(CH$_3$)$_3$)(N(CH$_3$)$_2$); Sb(NC(CH$_3$)$_3$CHCHNC(CH$_3$)$_3$)(CH$_3$); Sb(NC(CH$_3$)$_3$CHCHNC(CH$_3$)$_3$)(C$_2$H$_5$); Ti(NC(CH$_3$)$_3$CHCHNC(CH$_3$)$_3$)(N(CH$_3$)$_2$)$_2$; Si(NC(CH$_3$)$_3$CHCHNC(CH$_3$)$_3$)(N(CH$_3$)$_2$)$_2$; Ge(NC(CH$_3$)$_3$CHCHNC(CH$_3$)$_3$)(N(CH$_3$)$_2$)$_2$; Sn(NC(CH$_3$)$_3$CHCHN(C(CH$_3$)$_3$)(N(CH$_3$)$_2$)$_2$; Ru(NC(CH$_3$)$_3$CHCHN(C(CH$_3$)$_3$)(iPrNC(CH$_3$)NiPr)$_2$; Ta(NC(CH$_3$)$_3$CHCHNC(CH$_3$)$_3$)(NMe$_2$)$_3$; and Nb(NC(CH$_3$)$_3$CHCHNC(CH$_3$)$_3$)(NMe$_2$)$_3$.

4. The method of claim 3, wherein the precursor is Ti(NCH(CH$_3$)$_2$CHCHNCH(CH$_3$)$_2$).

5. A method of forming a metal containing film on a substrate, comprising:
  a) providing a reactor and at least one substrate disposed therein;
  b) introducing a metal precursor into the reactor, wherein the metal precursor is selected from the group consisting of:
  Ti(N(tBu)CH$_2$CH$_2$N(tBu))(NMe$_2$)$_2$; Zr(N(tBu)CH$_2$CH$_2$N(tBu))(NMe$_2$)$_2$; and Ni(SiNC(CH$_3$)$_3$CH$_2$CH$_2$NC(CH$_3$)$_3$)$_4$;
  c) maintaining the reactor at a temperature of at least about 100° C.; and
  d) decomposing the metal precursor onto the substrate to form a metal containing film.

6. The method of claim 5, wherein the precursor is Ti(N(tBu)CH$_2$CH$_2$N(tBu))(NMe$_2$)$_2$.

7. The method of claim 1, further comprising maintaining the reactor at a temperature between about 100° C. and about 500° C.

8. The method of claim 7, further comprising maintaining the reactor at a temperature between about 200° C. and about 350° C.

9. The method of claim 1, further comprising maintaining the reactor at a pressure between about 1 Pa and about $10^5$ Pa.

10. The method of claim 9, further comprising maintaining the reactor at a pressure between about 25 Pa and about $10^3$ Pa.

11. The method of claim 1, further comprising introducing at least one reducing gas into the reactor, wherein the reducing gas comprises at least one member selected from the group consisting of: H$_2$; NH$_3$; SiH$_4$; Si$_2$H$_6$; Si$_3$H$_8$; hydrogen radicals; and mixtures thereof.

12. The method of claim 11, wherein the metal precursor and the reducing gas are introduced into the chamber either substantially simultaneously, or sequentially.

13. The method of claim 12, wherein the reducing gas and the metal precursor are introduced into the chamber substantially simultaneously, and the chamber is configured for chemical vapor deposition.

14. The method of claim 12, the reducing gas, and the metal precursor are introduced into the chamber sequentially, and the chamber is configured for atomic layer deposition.

15. The method of claim 1, further comprising introducing at least one oxidizing gas into the reactor, wherein the oxidizing gas comprises at least one member selected from the group consisting of: O$_2$; O$_3$; H$_2$O; H$_2$O$_2$; NO; N$_2$O, oxygen radicals; and mixtures thereof.

16. The method of claim 15, wherein the metal containing precursor and the oxidizing gas are introduced into the chamber either substantially simultaneously, or sequentially.

17. The method of claim 15, wherein the metal containing precursor and the oxidizing gas are introduced into the chamber substantially simultaneously, and the chamber is configured for chemical vapor deposition.

18. The method of claim 15, wherein the metal containing precursor and the oxidizing gas are introduced into the chamber sequentially, and the chamber is configured for atomic layer deposition.

19. A metal containing thin film coated substrate comprising the product of the method of claim 1.

20. The method of claim 3, wherein the precursor is Ti(NC(CH$_3$)$_3$CHCHNC(CH$_3$)$_3$)(N(CH$_3$)$_2$)$_2$.

* * * * *